United States Patent
Kira et al.

(10) Patent No.: US 9,536,857 B1
(45) Date of Patent: Jan. 3, 2017

(54) HEATING HEADER OF SEMICONDUCTOR MOUNTING APPARATUS AND BONDING METHOD FOR SEMICONDUCTOR

(71) Applicant: FUJITSU LIMITED, Kawasaki-shi, Kanagawa (JP)

(72) Inventors: Hidehiko Kira, Nagano (JP); Takumi Masuyama, Kawasaki (JP); Norio Kainuma, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/209,846

(22) Filed: Jul. 14, 2016

(30) Foreign Application Priority Data

Aug. 26, 2015 (JP) ................. 2015-166794

(51) Int. Cl.
*H01L 23/00* (2006.01)
*H01L 21/56* (2006.01)

(52) U.S. Cl.
CPC ............... *H01L 24/75* (2013.01); *H01L 21/56* (2013.01); *H01L 24/81* (2013.01); *H01L 2224/75252* (2013.01); *H01L 2224/81203* (2013.01); *H01L 2224/81805* (2013.01)

(58) Field of Classification Search
CPC ........... H01L 24/75; H01L 21/56; H01L 24/81
See application file for complete search history.

(56) References Cited

U.S. PATENT DOCUMENTS

| | | | |
|---|---|---|---|
| 2003/0115747 A1* | 6/2003 | Schnetzler | H01L 21/6838 29/830 |
| 2011/0020983 A1* | 1/2011 | Tomura | H01L 21/563 438/108 |
| 2015/0357226 A1* | 12/2015 | Liu | H01L 25/50 438/457 |

FOREIGN PATENT DOCUMENTS

| | | |
|---|---|---|
| JP | 2000-332390 | 11/2000 |
| JP | 2011-066027 | 3/2011 |
| JP | 2015-018897 | 1/2015 |

\* cited by examiner

*Primary Examiner* — Errol Fernandes
(74) *Attorney, Agent, or Firm* — Fujitsu Patent Center

(57) ABSTRACT

A heating header of a semiconductor mounting apparatus includes: a first material; and a second material, the second material being bonded to the first material and coming into contact with a first semiconductor chip when the first semiconductor chip is compressed, wherein a contact surface of the second material with the first semiconductor chip is a curved surface that is convex toward the first semiconductor chip side, and the contact surface of the second material with the first semiconductor chip becomes a planar surface when each temperature of the first material and the second material reaches a melting temperature of a solder that is formed between a first terminal of the first semiconductor chip and a second terminal of a second semiconductor chip.

5 Claims, 11 Drawing Sheets

FIG.10

|  | C2801 | A5052 | SiC | AlN | Al2O3 |
|---|---|---|---|---|---|
| THERMAL EXPANSION RATE $\alpha$ [1/K] | 1.90E-05 | 2.38E-05 | 3.70E-06 | 4.50E-06 | 7.20E-06 |
| YOUNG'S MODULUS E [Pa] | 1.30E-05 | 7.00E+11 | 4.40E+11 | 3.20E+11 | 3.60E+11 |

FIG.11

| MATERIAL 31 \ MATERIAL 32 | C2801 | A5052 | SiC | AlN | Al2O3 |
|---|---|---|---|---|---|
| C2801 | | — | — | — | — |
| A5052 | 0.042 / 1186 | | — | — | — |
| SiC | -0.125 / -401 | -0.142 / -353 | | — | — |
| AlN | -0.124 / -404 | -0.148 / -338 | 0.007 / 6989 | | — |
| Al2O3 | -0.099 / -504 | -0.124 / -404 | 0.031 / 1591 | 0.024 / 2059 | |

US 9,536,857 B1

HEATING HEADER OF SEMICONDUCTOR MOUNTING APPARATUS AND BONDING METHOD FOR SEMICONDUCTOR

CROSS-REFERENCE TO RELATED APPLICATION

This application is based upon and claims the benefit of prior Japanese Patent Application No. 2015-166794 filed on Aug. 26, 2015, the entire contents of which are incorporated herein by reference.

FIELD

An embodiment relates to a heating header of a semiconductor mounting apparatus and a bonding method for a semiconductor.

BACKGROUND

As processors and memories to be used in servers and the like, a laminated semiconductor chip in which a plurality of semiconductor chips are laminated is sometimes used for enhancement of performance. As illustrated in FIG. 12, terminals (micro-bumps) 102 in each of which a solder 103 is provided on the top of a cupper pole (a Cu post or a Cu pillar) are formed on a semiconductor chip 101. There is used a method of laminating a plurality of semiconductor chips 101 by bonding the terminals 102 of the plurality of semiconductor chips 101 to each other.

As illustrated in FIG. 13, a paste-like or film-like reinforcement resin 104 is supplied on the semiconductor chip 101, for securing the bonding reliability after the plurality of semiconductor chips 101 are laminated. The paste-like reinforcement resin 104 is called an NCP (Non-conductive Paste), and the film-like reinforcement resin 104 is called an NCF (Non-conductive Film). As illustrated in FIG. 14 and FIG. 15, using a heating header 201 of a semiconductor mounting apparatus such as a flip-chip bonder, terminals 102A and solders 103A of a semiconductor chip 101A push and penetrate the reinforcement resin 104, while the semiconductor chip 101A is heated and compressed. The solders 103A of the semiconductor chip 101A and solders 103B of a semiconductor chip 1016 are bonded, and thereby, the conduction and hardness between the semiconductor chip 101A and the semiconductor chip 1016 are secured.

[Patent document 1] Japanese Laid-open Patent Publication No. 2000-332390
[Patent document 2] Japanese Laid-open Patent Publication No. 2011-66027
[Patent document 3] Japanese Laid-open Patent Publication No. 2015-18897

SUMMARY

According to an aspect of the application, a heating header of a semiconductor mounting apparatus includes: a first material; and a second material, the second material being bonded to the first material and coming into contact with a first semiconductor chip when the first semiconductor chip is compressed, wherein a contact surface of the second material with the first semiconductor chip is a curved surface that is convex toward the first semiconductor chip side, and the contact surface of the second material with the first semiconductor chip becomes a planar surface when each temperature of the first material and the second material reaches a melting temperature of a solder that is formed between a first terminal of the first semiconductor chip and a second terminal of a second semiconductor chip.

According to an aspect of the application, a bonding method for a semiconductor includes: forming a first solder on each of a plurality of first terminals formed on a first semiconductor chip; forming a second solder on each of a plurality of second terminals formed on a second semiconductor chip; forming a resin on the second semiconductor chip such that the resin covers the second terminal and the second solder; placing the first semiconductor chip on the resin such that the plurality of first terminals face the plurality of second terminals; making a second material of a heating header contact with the first semiconductor chip, the heating header including a first material and the second material, the second material being bonded to the first material; and heating and compressing the first semiconductor chip to bond the first solder and the second solder, wherein a contact surface of the second material with the first semiconductor chip is a curved surface that is convex toward the first semiconductor chip side, and the contact surface of the second material with the first semiconductor chip becomes a planar surface when each temperature of the first material and the second material reaches a melting temperature of the first solder and the second solder in the bonding.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 10 is a diagram indicating an example of the material name, thermal expansion rate and Young's modulus of each material;
FIG. 11 is a diagram indicating the warp amount and curvature radius of each material.

DESCRIPTION OF EMBODIMENT

The heating by the heating header 201 produces a temperature difference between an upper portion (the side of the heating header 201) of the semiconductor chip 101A and a lower portion (the side of the terminals 102A) of the semiconductor chip 101A. Therefore, the thermal expansion at the upper portion of the semiconductor chip 101A is larger than the thermal expansion at the lower portion of the semiconductor chip 101A, and a warp appears on the semiconductor chip 101A. For bonding the terminals 102A of the semiconductor chip 101A and the terminals 102B of the semiconductor chip 1016, it is desirable to suppress the warp amount of the semiconductor chip 101A to 5 μm or less.

Figure 16:
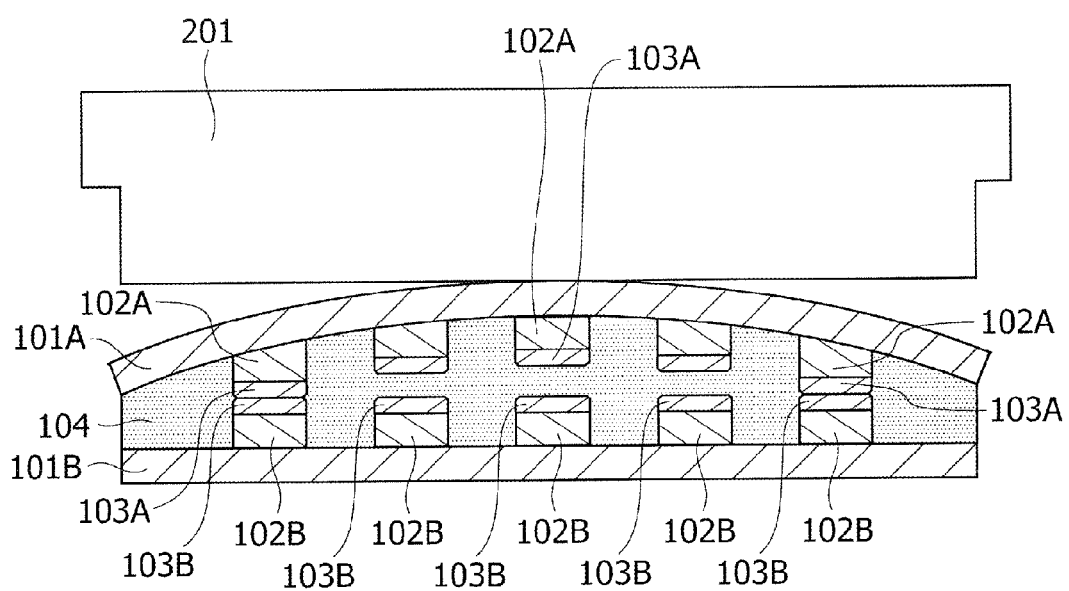
FIG. 16 is an explanatory diagram of the bonding method for the semiconductor chip.

In the case where the external size of the chip is 20 mm square or greater, the warp amount of the semiconductor chip 101A sometimes exceeds 5 μm. Further, by the resistance of the reinforcement resin 104 interposed between the semiconductor chip 101A and the semiconductor chip 1016, it is sometimes impossible to push and penetrate the reinforcement resin 104. Therefore, there is a possibility that terminals 102A formed at a central portion of the semiconductor chip 101A and terminals 102B formed at a central portion of the semiconductor chip 1016 are not bonded as illustrated in FIG. 16. The absolute load for the contact and bonding of the terminals increases in proportion to the size of the semiconductor chip. However, when the load is increased simply, there is a possibility that the physical destruction of the semiconductor chip occurs.

Hereinafter, an embodiment will be described with reference to the drawings. The constitution of the embodiment is an example, and the present invention is not limited to the constitution of the embodiment.

Figure 1:
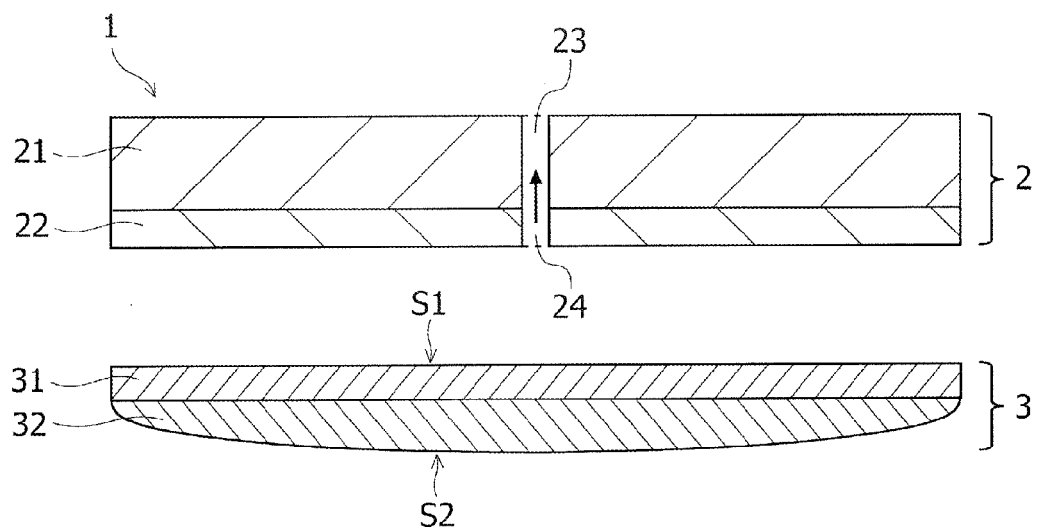
FIG. 1 is a cross-section view of a heating header.
Figure 2:
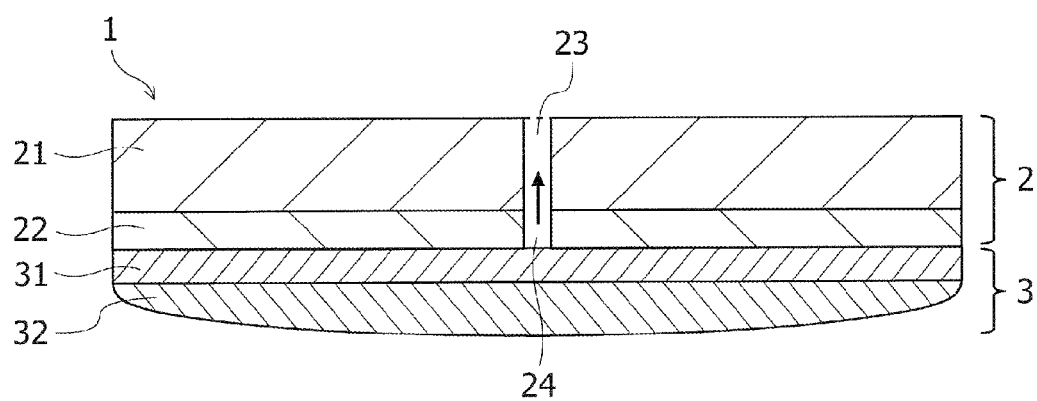
FIG. 2 is a cross-section view of the heating header.

FIG. 1 and FIG. 2 are cross-section views of a heating header 1 included in a semiconductor mounting apparatus. The semiconductor mounting apparatus, for example, is a flip-chip bonder. The heating header 1 includes an upper unit 2 having a heat insulating material 21 and a heater 22, and a bottom unit (lower unit) 3 having materials (members) 31, 32. The heater 22 is attached to the heat insulating material 21. The heat insulating material 21 has an adsorption hole 23, and the heater 22 has an adsorption hole 24. The adsorption hole 23 of the heat insulating material 21 passes through the heat insulating material 21. The adsorption hole 24 of the heater 22 passes through the heater 22. Above the heat insulating material 21, an adsorption mechanism not illustrated is provided. The adsorption mechanism performs suction from the adsorption hole 23 of the heat insulating material 21 and the adsorption hole 24 of the heater 22, so that the bottom unit 3 is adsorbed to the upper unit 2 of the heating header 1.

The heater 22 is a heating mechanism, and heats the materials 31, 31. The materials 31, 32, for example, are metal materials, alloy materials or ceramic materials. The materials 31, 32 have a good thermal conductivity. The material 31 and the material 32 are bonded, for example, by roll bonding. The thermal expansion rate (thermal expansion coefficient) of the material 31 is different from the thermal expansion rate of the material 32, and the thermal expansion rate of the material 31 is higher than the thermal expansion rate of the material 32. Among the surfaces of the material 31, the opposite surface (S1 in FIG. 1) to the bonding surface with the material 32 is a planar surface. Among the surfaces of the material 32, the opposite surface (S2 in FIG. 1) to the bonding surface with the material 31 is convex toward the opposite side to the material 31. Accordingly, the material 32 has a convex shape (dome shape) and has a curved surface that is convex toward the opposite side to the material 31. The material 31 is an example of the first material. The material 32 is an example of the second material.

For example, the material 32 may be formed by pouring a ceramic material into a mold and sintering the ceramic material. For example, the material 32 may be formed by the turning processing or milling processing of a flat plate shaped metal material, a flat plate shaped alloy material or a flat plate shaped ceramic material.

Figure 3:
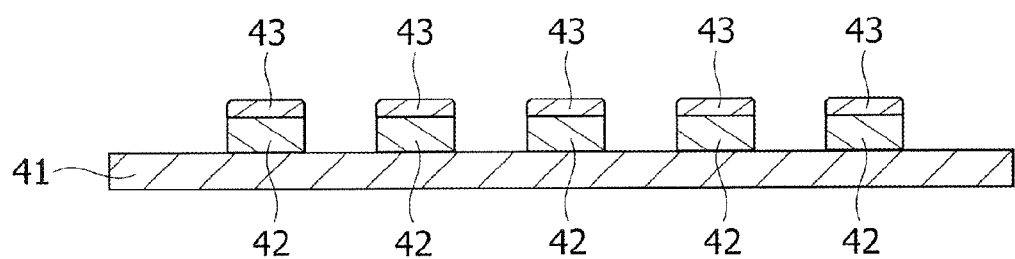
FIG. 3 is a process diagram of a mounting flow according to an embodiment.

A mounting flow according to the embodiment will be described with reference to FIG. 3 to FIG. 9. The mounting flow according to the embodiment may be used as a bonding method for semiconductor chips 41, 51, or may be used as a bonding method or a manufacturing method for a semiconductor apparatus including the semiconductor chips 41, 51. As illustrated in FIG. 3, a solder 43 is formed on each of a plurality of terminals 42 formed on the semiconductor chip 41. The plurality of terminals 42 are arranged on a surface on which a circuit of the semiconductor chip 41 is formed (hereinafter, referred to as a "circuit surface of the semiconductor chip 41"). The solder 43, for example, is a solder paste containing solder powder and flux. The solder powder, for example, is Sn or an alloy containing Sn. For example, the solder 43 may be formed on the plurality of terminals 42, using a dispenser. The terminal 42 is an example of the first terminal. The solder 43 is an example of the first solder.

Figure 4:
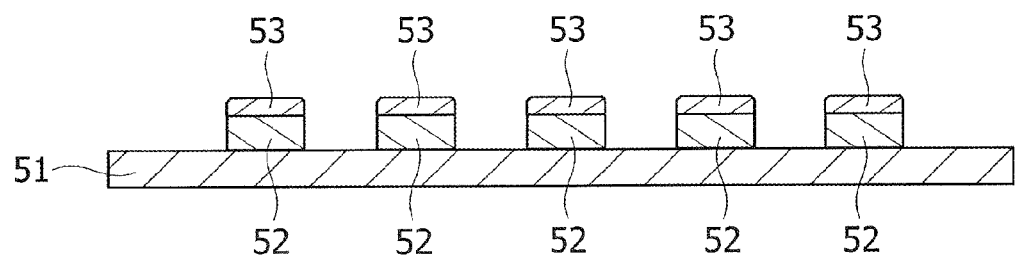
FIG. 4 is a process diagram of the mounting flow according to the embodiment.

Next, as illustrated in FIG. 4, a solder 53 is formed on each of a plurality of terminals 52 formed on the semiconductor chip 51. The plurality of terminals 52 are arranged on a surface on which a circuit of the semiconductor chip 51 is formed (hereinafter, referred to as a "circuit surface of the semiconductor chip 51"). The solder 53, for example, is a solder paste containing solder powder and flux. The solder powder, for example, is Sn or an alloy containing Sn. For example, the solder 53 may be formed on the plurality of terminals 52, using a dispenser. The terminal 52 is an example of the second terminal. The solder 53 is an example of the second solder.

Figure 5:
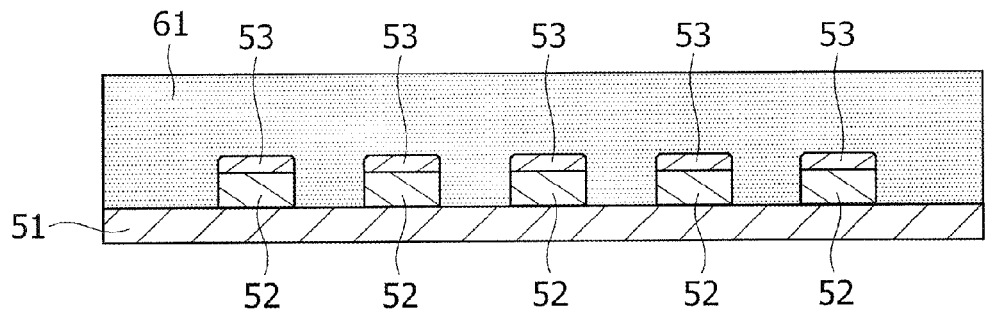
FIG. 5 is a process diagram of the mounting flow according to the embodiment.

Subsequently, as illustrated in FIG. 5, a reinforcement resin 61 is formed on the semiconductor chip 51 such that the reinforcement resin 61 covers the terminals 52 and the solders 53. Accordingly, the terminals 52 and the solders 53 are put into a state of being buried within the reinforcement resin 61. The reinforcement resin 61 may be a paste-like NCP, or may be a film-like NCF. The reinforcement resin 61 is an example of the resin.

In the above description, an example in which after the step illustrated in FIG. 3 is performed, the step illustrated in FIG. 4 is performed, and thereafter the step illustrated in FIG. 5 is performed has been described. The order of the steps illustrated in FIG. 3 to FIG. 5 may be changed as follows. After the step illustrated in FIG. 4 is performed, the step illustrated in FIG. 5 may be performed, and thereafter the step illustrated in FIG. 3 may be performed. Further, after the step illustrated in FIG. 4 is performed, the step illustrated in FIG. 3 may be performed, and thereafter the step illustrated in FIG. 5 may be performed.

Figure 6:
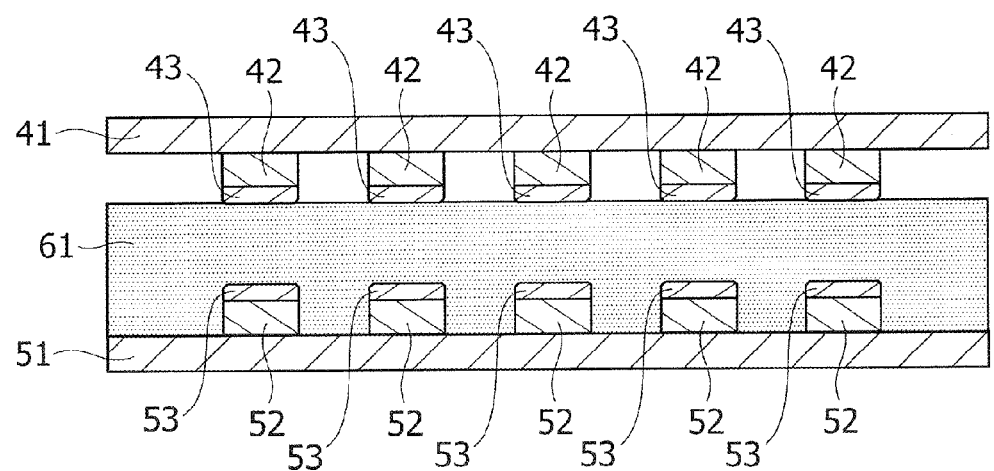
FIG. 6 is a process diagram of the mounting flow according to the embodiment.
Figure 7:
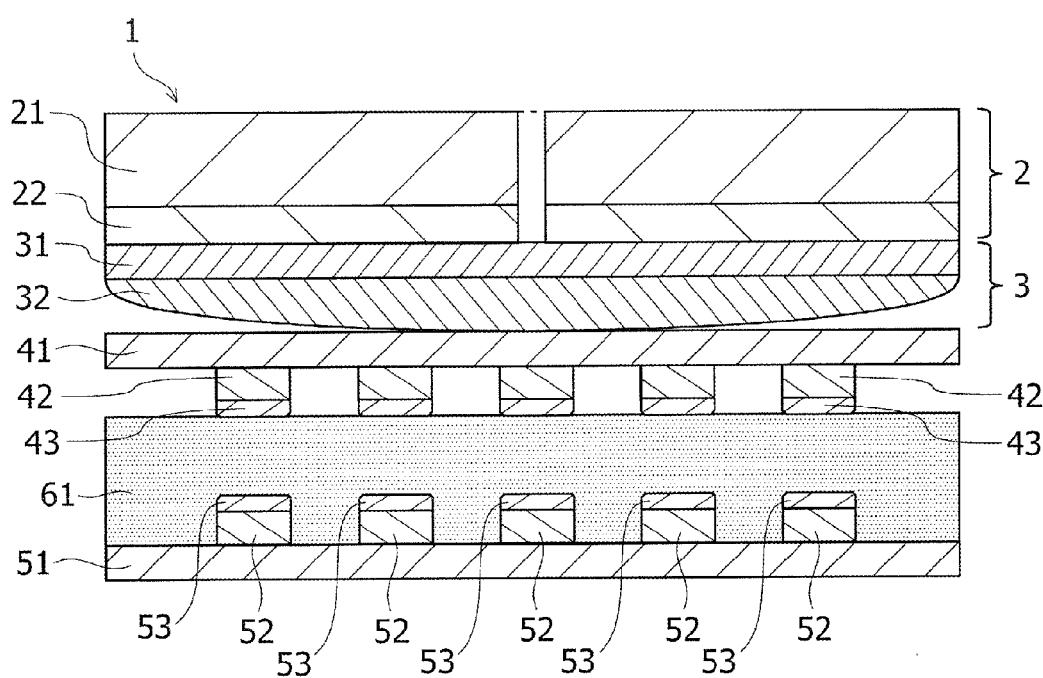
FIG. 7 is a process diagram of the mounting flow according to the embodiment.

Next, as illustrated in FIG. 6, the semiconductor chip 41 is placed on the reinforcement resin 61 such that the plurality of terminals 42 face the plurality of terminals 52. Accordingly, the circuit surface of the semiconductor chip 41 faces the circuit surface of the semiconductor chip 51. Subsequently, as illustrated in FIG. 7, the heating header 1 is pressed against the surface on the opposite side to the circuit surface of the semiconductor chip 41 (hereinafter, referred to as the "back surface of the semiconductor chip 41"). Accordingly, the material 32 of the bottom unit 3 included in the heating header 1 is pressed against the back surface of the semiconductor chip 41, and the material 32 is put into a state of contacting with the back surface of the semiconductor chip 41. At this time, the heating by the heater 22 is not performed, and each temperature of the materials 31, 32 is an ordinary temperature. When each temperature of the materials 31, 32 is an ordinary temperature, the contact surface of the material 32 with the semiconductor chip 41 is a curved surface that is convex toward the side of the semiconductor chip 41. The ordinary temperature includes, for example, 5° C. to 35° C.

Since the contact surface of the material 32 with the semiconductor chip 41 is a curved surface that is convex toward the side of the semiconductor chip 41, the material 32 is pressed against a central portion of the back surface of the semiconductor chip 41. That is, the material 32 contacts with the central portion of the back surface of the semiconductor chip 41. In the state in which the material 32 contacts with the semiconductor chip 41, the heating and compressing of the semiconductor chip 41 is started. The compressing of the semiconductor chip 41 may be started after the heating of the semiconductor chip 41 is started, or the heating of the semiconductor chip 41 may be started after the compressing of the semiconductor chip 41 is started. Thus, the starting time point of the heating of the semiconductor chip 41 may be different from the starting time point of the compressing of the semiconductor chip 41. Further, the heating and compressing of the semiconductor chip 41 may be started at the same time.

The heating temperature of the heater 22 is increased, and thereby the semiconductor chip 41 is heated. That is, the heat generated by the heater 22 is transferred to the materials 31, 32, and thereby the semiconductor chip 41 is heated. Above the heat insulating material 21, a compressing mechanism not illustrated is provided. By the drive of the compressing mechanism, a load is given to the semiconductor chip 41, and the semiconductor chip 41 is compressed.

Since the material 32 contacts with the back surface of the semiconductor chip 41, the temperature of the back surface of the semiconductor chip 41 is higher than the temperature of the circuit surface of the semiconductor chip 41, resulting in a temperature difference between the front and back of the semiconductor chip 41. The material 32 contacts with the central portion of the back surface of the semiconductor chip 41, and the material 32 does not contact with a peripheral portion of the back surface of the semiconductor chip 41. Accordingly, the central portion of the semiconductor chip 41 starts to warp, such that the central portion of the semiconductor chip 41 rises to the side of the heating header 1. However, since the material 32 contacts with the central portion of the back surface of the semiconductor chip 41, the load is concentrated on the central portion of the semiconductor chip 41, and the warp of the central portion of the semiconductor chip 41 is suppressed.

In the above description, after the heating header 1 is pressed against the back surface of the semiconductor chip 41, the heating temperature of the heater 22 is increased, and the heating of the semiconductor chip 41 is started. The embodiment is not limited to the above example, and the heating temperature of the heater 22 may be increased before the heating header 1 is pressed against the back surface of the semiconductor chip 41. In this case, as soon as the material 32 comes into contact with the semiconductor chip 41, the heating of the semiconductor chip 41 is started. Thereafter, the compressing of the semiconductor chip 41 may be started. Thus, the starting time point of the heating of the semiconductor chip 41 may be different from the starting time point of the compressing of the semiconductor chip 41. Further, the starting time point of the heating of the semiconductor chip 41 may be matched with the starting time point of the compressing of the semiconductor chip 41, by starting the compressing of the semiconductor chip 41 as soon as the material 32 comes into contact with the semiconductor chip 41.

Figure 8:
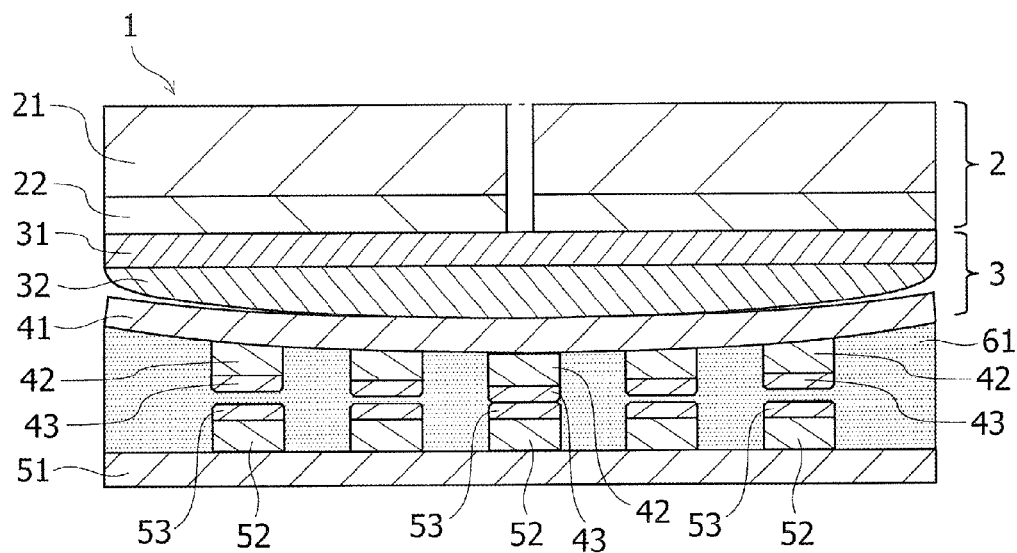
FIG. 8 is a process diagram of the mounting flow according to the embodiment.

The heat is transferred from the semiconductor chip 41 to the reinforcement resin 61 through the terminals 42 and the solders 43. The reinforcement resin 61 is heated, and thereby, the reinforcement resin 61 is softened. In the state in which the reinforcement resin 61 is softened, the semiconductor chip 41 is compressed. Thereby, the terminals 42 and the solders 43 are buried in the reinforcement resin 61, and therewith, the reinforcement resin 61 is pushed out. As illustrated in FIG. 8, the load is concentrated on the central portion of the semiconductor chip 41, and therefore, the distance between the central portion of the semiconductor chip 41 and the central portion of the semiconductor chip 51 is shorter than the distance between the peripheral portion of the semiconductor chip 41 and the peripheral portion of the semiconductor chip 51. The reinforcement resin 61 under the central portion of the semiconductor chip 41 is pushed and penetrated, and the solders 43 formed on the terminals 42 at the central portion of the semiconductor chip 41 come into contact with the solders 53 formed on the terminals 52 at the central portion of the semiconductor chip 51.

Figure 9:
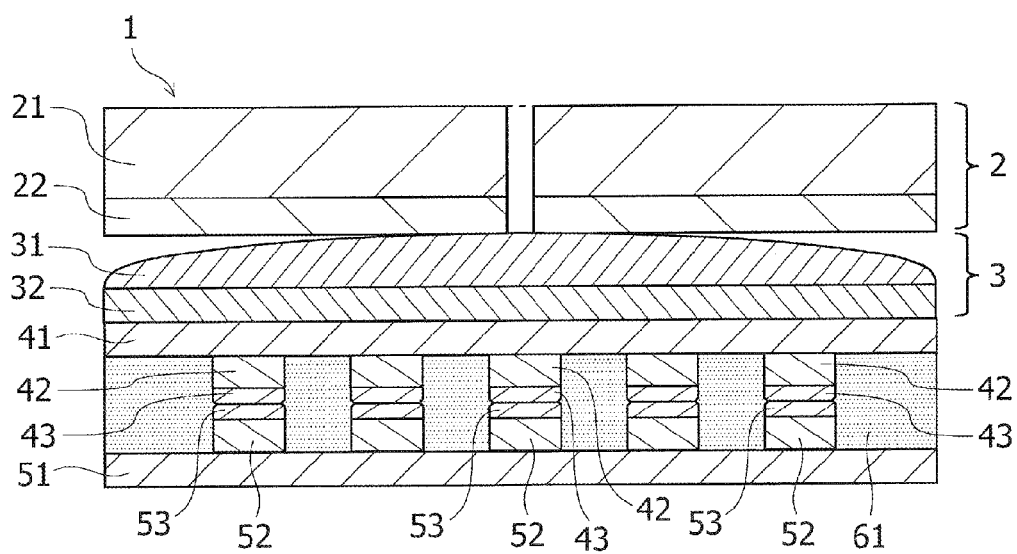
FIG. 9 is a process diagram of the mounting flow according to the embodiment.
Figure 12:
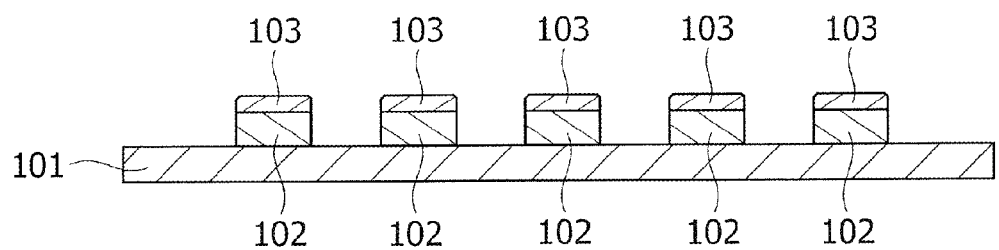
FIG. 12 is an explanatory diagram of a bonding method for a semiconductor chip.
Figure 13:
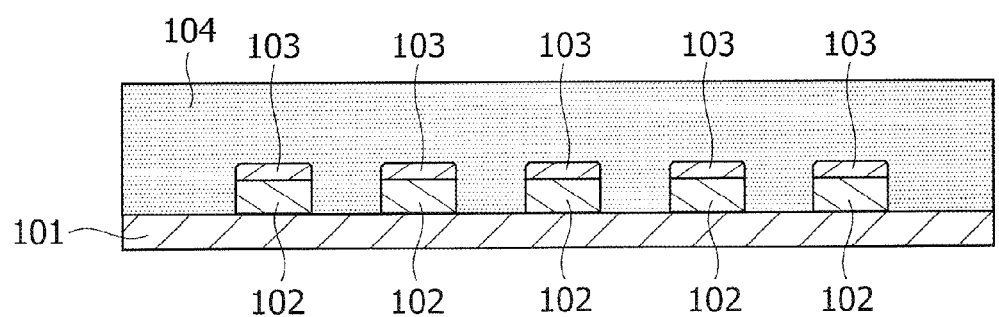
FIG. 13 is an explanatory diagram of the bonding method for the semiconductor chip.
Figure 14:
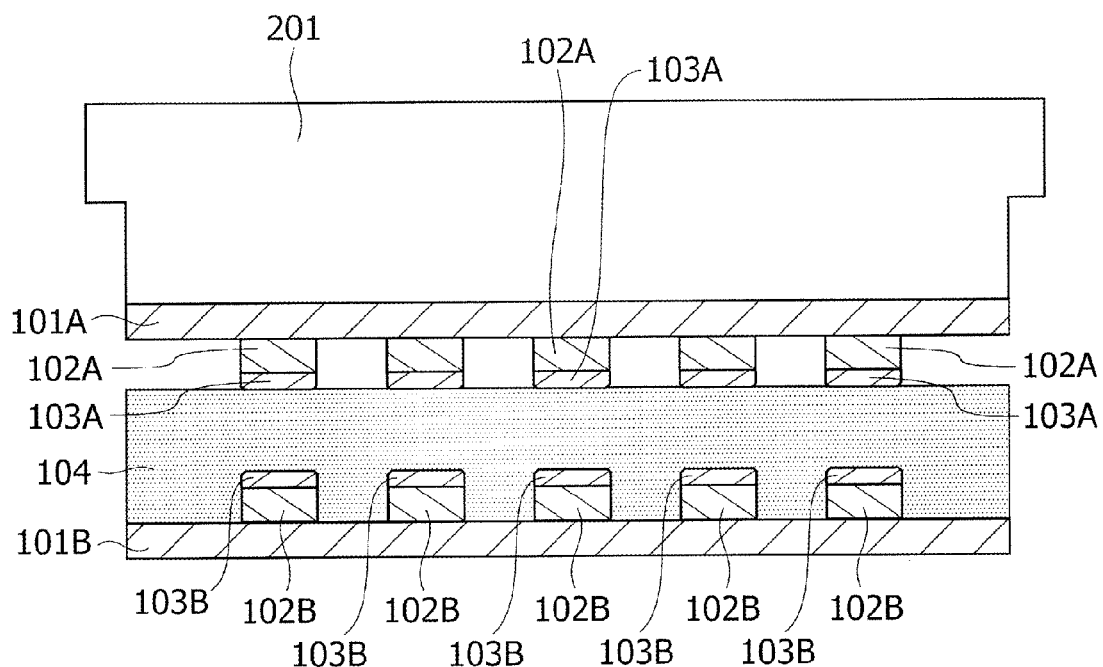
FIG. 14 is an explanatory diagram of the bonding method for the semiconductor chip.
Figure 15:
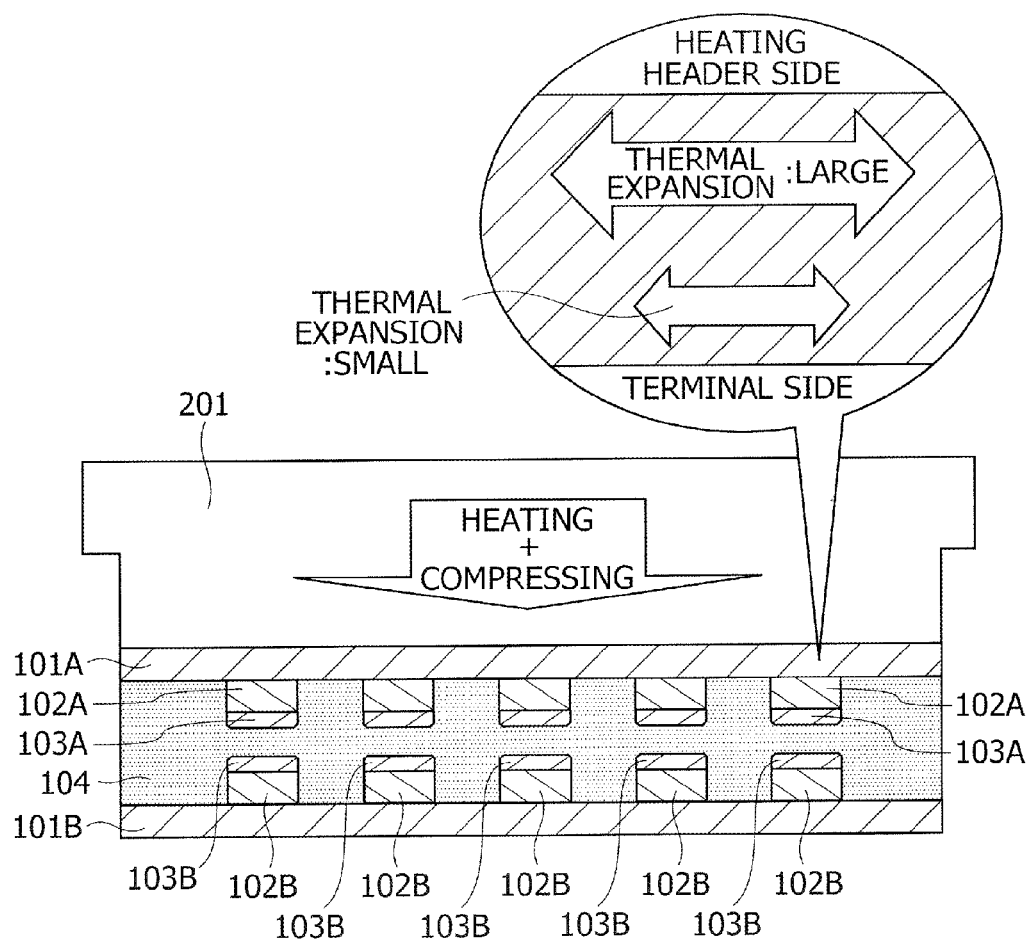
FIG. 15 is an explanatory diagram of the bonding method for the semiconductor chip.

The thermal expansion rate of the material 31 is higher than the thermal expansion rate of the material 32, and therefore, when the heating by the heater 22 progresses, the material 31 warps to the side of the material 32 (the side of the semiconductor chip 41). Thereby, the material 32 is deformed from the convex shape to a flat plate shape, and the contact surface of the material 32 with the semiconductor chip 41 becomes a planar surface. Since the contact surface of the material 32 with the semiconductor chip 41 is a planar surface as illustrated in FIG. 9, the load is applied to the whole of the semiconductor chip 41, and the load on the semiconductor chip 41 is evened. The peripheral portion of the semiconductor chip 41 is pushed to the side of the semiconductor chip 51, and thereby, the warp of the semiconductor chip 41 is suppressed. As a result, the solders 43 formed on the terminals 42 at the peripheral portion of the semiconductor chip 41 come into contact with the solders 53 formed on the terminals 52 at the peripheral portion of the semiconductor chip 51.

The progress of the heating by the heater 22 melts the solders 43, 53 formed between the terminals 42 of the semiconductor chip 41 and the terminals 52 of the semiconductor chip 51, so that the solders 43 and the solders 53 are bonded. Further, the terminals 42 and the solders 43 are bonded, and the terminals 52 and the solders 53 are bonded. Since the terminals 42 and the terminals 52 are bonded through the solders 43, 53, the semiconductor chip 41 and the semiconductor chip 51 are mechanically connected, and the semiconductor chip 41 and the semiconductor chip 51 are electrically connected.

The contact surface of the material 32 with the semiconductor chip 41 may be a planar surface at the time point when each temperature of the materials 31, 32 reaches the melting temperature of the solders 43, 53. Further, the contact surface of the material 32 with the semiconductor chip 41 may be a planar surface from a time point before each temperature of the materials 31, 32 reaches the melting temperature of the solders 43, 53 to the time point when each temperature of the materials 31, 32 reaches the melting temperature of the solders 43, 53. Accordingly, when each temperature of the materials 31, 32 reaches the melting temperature of the solders 43, 53 formed between the terminals 42 of the semiconductor chip 41 and the terminals 52 of the semiconductor chip 51, the contact surface of the material 32 with the semiconductor chip 41 becomes a planar surface. The contact surface of the material 32 with the semiconductor chip 41 is a planar surface until the bonding between the terminals 42 and the terminals 52 are completed, and therefore, the occurrence of the imperfect bonding of the terminals 42, 52 is suppressed. By the completion of the bonding between the terminals 42 and the terminals 52, a semiconductor device including the semiconductor chips 41, 51 is produced. The temporary curing of the reinforcement resin 61 is completed at the temperature at which the solders 43, 53 melt.

The external size (the area in planar view) of the material 32 may be equal to the external size (the area in planar view) of the semiconductor chip 41, or the external size of the material 32 may be larger than the external size of the semiconductor chip 41. When the external size of the material 32 is equal to the external size of the semiconductor chip 41 or is larger than the external size of the semiconductor chip 41, the load on the semiconductor chip 41 is easily evened.

The external size of the material 32 may be equal to the size (the area in planar view) of a formation region for the terminals 42 in the semiconductor chip 41, or the external size of the material 32 may be larger than the size of the formation region for the terminals 42 in the semiconductor chip 41. For example, in the case where the plurality of terminals 42 are arranged in a predetermined region on the circuit surface of the semiconductor chip 41, the formation region for the terminals 42 in the semiconductor chip 41 is the size (the area in planar view) of the predetermined region in the semiconductor chip 41. When the external size of the material 32 is equal to the formation region for the terminals 42 in the semiconductor chip 41 or is larger than the formation region for the terminals 42 in the semiconductor chip 41, the load on the plurality of terminals 42 of the semiconductor chip 41 is easily evened.

In a conventional mounting apparatus, for giving an even load to the semiconductor chip 41, it is demanded to give a load of 50 kg/20 mm² or more to the semiconductor chip 41. In the semiconductor mounting apparatus according to the embodiment, the local loading is performed on the semiconductor chip 41 at the initial stage of the compressing of the semiconductor chip 41, and the even loading is performed on the semiconductor chip 41 at the time of the bonding between the terminals 42 and the terminals 52. Thereby, it is possible to suppress the warp of the semiconductor chip 41, and to bond the terminals 42 and the terminals 52, without giving, to the semiconductor chip 41, a load causing the physical destruction. In the semiconductor mounting apparatus according to the embodiment, it is possible to bond the semiconductor chips 41, 51 of 20 mm square or greater, for example, by compressing the semiconductor chip 41 with a low load of 50 kg/20 mm² mm or less.

<Example>

In the heating process by the heater 22, after the heating is started, the temperature may be increased in stages. At a first stage (at the time of an ordinary temperature) before the heating is performed, the material 32 contacts with the central portion of the back surface of the semiconductor chip 41, and in this state, the pressing force to the semiconductor chip 41 is concentrated on the central portion of the semiconductor chip 41 (see FIG. 7). At a second stage after the heating is started, the reinforcement resin 61 is softened, and the terminals 42 and the solders 43 formed at the central portion of the semiconductor chip 41 push and penetrate the central portion of the reinforcement resin 61 preferentially (see FIG. 8). Thereby, it is possible to send the excess reinforcement resin 61 to the outside, without including it between the central portion of the semiconductor chip 41 and the central portion of the semiconductor chip 51.

At a third stage, the temperature is further increased compared to the second stage. The contact surface of the material 32 with the semiconductor chip 41 is deformed from the convex curved surface to a planar surface, and therefore, in this state, the pressing force concentrated on the central portion of the semiconductor chip 41 is dispersed to the peripheral portion of the semiconductor chip 41 (see FIG. 9). Finally, each temperature of the materials 31, 32 reaches the melting temperature of the solders 43, 53, and the contact surface of the material 32 with the semiconductor chip 41 becomes a planar surface with no warp 1 µm).

In the case where the semiconductor chip 41 of 20 mm square or greater is mounted on the semiconductor chip 51, it is preferable that the external size of the material 32 be equal to or greater than the external size of the semiconductor chip 41. The materials 31, 32 may be selected based on thermal expansion rate ($\alpha$) and Young's modulus (E), or the materials 31, 32 may be selected based on thermal expansion rate. FIG. 10 indicates examples of the material names, thermal expansion rates and Young's moduli of the materials 31, 32. The embodiment is not limited to the examples indicated in FIG. 10, and other materials may be used. For example, in the case where the difference between the thermal expansion rate of the material 31 and the thermal expansion rate of the material 32 is large, the warp amount of the material 31 is large. In this case, the warp amount of the material 31 is suppressed by selecting the material 31 having a high Young's modulus.

The curvature radius of the convex shape (convex curved surface) of the material 32 at the time of an ordinary temperature is determined such that the contact surface of the material 32 with the semiconductor chip 41 becomes a planar surface at the time of reaching a targeted heating temperature (for example, the melting temperature of the solders 43, 53). The warp amount of the material 31 and the curvature radius of the curved surface of the material 32 depend on the thermal expansion rates, Young's moduli and thicknesses of the selected materials 31, 32. Therefore, the materials 31, 32 are selected and the thicknesses of the materials 31, 32 are determined, such that the material 31 generates a warp amount equivalent to or more than the inter-terminal gap amount (=the pushing amount of the semiconductor chip 41 by the material 31) that appears in the case where the semiconductor chips 41, 51 are mounted by the conventional mounting scheme. In the case where the thicknesses of the materials 31, 32 are too small, there is a possibility that the heat warp action is restrained by the pressing force. On the other hand, in the case where the thicknesses of the materials 31, 32 are too large, there is a possibility that the heat transfer property is poor and the performance of the heating header 1 is impaired. Therefore, it is preferable that each thickness of the materials 31, 32 be 1 mm or greater and 3 mm or less, depending on the selection of the materials 31, 32.

FIG. 11 indicates the warp amount 6 and curvature radius R of the material 31 in a combination of the materials 31, 32 when each temperature of the materials 31, 32 reaches the melting temperature (for example, 240° C.) of the solders 43, 53. In FIG. 11, the warp amount 6 and curvature radius R of the material 31 is evaluated by a logical formula for bimetal. In FIG. 11, the upper row of each column indicates the warp amount 6 (mm) of the material 31, and the lower row of each column indicates the curvature radius R (mm) of the material 31. Here, the values indicated in FIG. 11 are examples, and the embodiment is not limited to the values indicated in FIG. 11.

For example, in the case where the semiconductor chips 41, 51 are mounted by the conventional mounting scheme and the warp amount (=inter-terminal gap amount) of the semiconductor chip 41 is 7 μm, it is preferable to select AlN as the material 31 and select SiC as the material 32. Further, as for the initial shape of the material 32 before the heating, it is preferable that the curvature radius R of the material 32 be about 7000 mm. In this case, when each temperature of the materials 31, 32 reaches the melting temperature of the solders 43, 53, the warp amount of the material 32 becomes 7 μm, and the contact surface of the material 32 with the semiconductor chip 41 becomes a planar surface. Accordingly, the pushing amount of the semiconductor chip 41 by the material 32 is 7 μm, and the warp of the semiconductor chip 41 is suppressed.

According to the application, it is possible to suppress the warp of the semiconductor chip and bond the terminals to each other with a low load.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A heating header of a semiconductor mounting apparatus comprising:
    a first material; and
    a second material, the second material being bonded to the first material and coming into contact with a first semiconductor chip when the first semiconductor chip is compressed,
    wherein a contact surface of the second material with the first semiconductor chip is a curved surface that is convex toward the first semiconductor chip side, and
    the contact surface of the second material with the first semiconductor chip becomes a planar surface when each temperature of the first material and the second material reaches a melting temperature of a solder that is formed between a first terminal of the first semiconductor chip and a second terminal of a second semiconductor chip.

2. The heating header of the semiconductor mounting apparatus according to claim 1, wherein a thermal expansion rate of the first material is higher than a thermal expansion rate of the second material.

3. The heating header of the semiconductor mounting apparatus according to claim 1, wherein a size of the second material is equal to a size of the first semiconductor chip or is larger than the size of the first semiconductor chip.

4. The heating header of the semiconductor mounting apparatus according to claim 1, wherein a size of the second material is equal to a size of a formation region for the first terminal or is larger than the size of the formation region for the first terminal.

5. A bonding method for a semiconductor comprising:
    forming a first solder on each of a plurality of first terminals formed on a first semiconductor chip;
    forming a second solder on each of a plurality of second terminals formed on a second semiconductor chip;
    forming a resin on the second semiconductor chip such that the resin covers the second terminal and the second solder;
    placing the first semiconductor chip on the resin such that the plurality of first terminals face the plurality of second terminals;
    making a second material of a heating header contact with the first semiconductor chip, the heating header including a first material and the second material, the second material being bonded to the first material; and
    heating and compressing the first semiconductor chip to bond the first solder and the second solder,
    wherein a contact surface of the second material with the first semiconductor chip is a curved surface that is convex toward the first semiconductor chip side, and
    the contact surface of the second material with the first semiconductor chip becomes a planar surface when each temperature of the first material and the second material reaches a melting temperature of the first solder and the second solder in the bonding.

* * * * *